(12) United States Patent
Ando et al.

(10) Patent No.: US 11,742,425 B2
(45) Date of Patent: Aug. 29, 2023

(54) FINFET DEVICE WITH PARTIAL INTERFACE DIPOLE FORMATION FOR REDUCTION OF GATE INDUCED DRAIN LEAKAGE

(71) Applicant: International Business Machines Corporation, Armonk, NY (US)

(72) Inventors: Takashi Ando, Eastchester, NY (US); Alexander Reznicek, Troy, NY (US); Pouya Hashemi, Purchase, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 16/665,836

(22) Filed: Oct. 28, 2019

(65) Prior Publication Data
US 2021/0126122 A1   Apr. 29, 2021

(51) Int. Cl.
*H01L 29/78* (2006.01)
*H01L 29/51* (2006.01)
(Continued)

(52) U.S. Cl.
CPC ...... *H01L 29/785* (2013.01); *H01L 21/76895* (2013.01); *H01L 29/42364* (2013.01); *H01L 29/42376* (2013.01); *H01L 29/512* (2013.01); *H01L 29/513* (2013.01); *H01L 29/517* (2013.01); *H01L 29/6653* (2013.01); *H01L 29/6656* (2013.01); *H01L 29/66545* (2013.01); *H01L 29/66795* (2013.01)

(58) Field of Classification Search
CPC ..... H01L 21/823431; H01L 21/823456; H01L 21/823462; H01L 29/42364; H01L 29/42368; H01L 29/42372; H01L 29/42376; H01L 29/511; H01L 29/512; H01L 29/513; H01L 29/517; H01L 29/66545; H01L 29/6653; H01L 29/6656; H01L 29/66795; H01L 29/7856
See application file for complete search history.

(56) References Cited

U.S. PATENT DOCUMENTS 8,012,828 B2   9/2011   Min et al.
9,548,304 B2   1/2017   Ji et al.
(Continued)

OTHER PUBLICATIONS

Jnirmal Ramaswamy, "Short Course 2: It's All About Memory, Not Logic!!!" International Electron Devices Meeting (IEDM), Dec. 2, 2018, 316 pages.

*Primary Examiner* — Marcos D. Pizarro
(74) *Attorney, Agent, or Firm* — Robert Sullivan; Ryan, Mason & Lewis, LLP (57) ABSTRACT

A semiconductor device includes a semiconductor substrate and a field effect transistor disposed on the semiconductor substrate. The field effect transistor includes a vertical fin defining a longitudinal length along a first axis, a width along a second axis and a vertical height along a third axis. The vertical fin includes source and drain regions separated by a gate region and a gate structure over the gate region. The gate structure includes a dipole layer and a gate electrode layer over the dipole layer. A first longitudinal section of the gate structure includes the dipole layer and a second longitudinal section of the gate structure is devoid of the dipole layer.

20 Claims, 8 Drawing Sheets

(51) Int. Cl.
*H01L 29/423* (2006.01)
*H01L 21/768* (2006.01)
*H01L 29/66* (2006.01)

(56) References Cited

U.S. PATENT DOCUMENTS

| | | |
|---|---|---|
| 9,595,583 B2 | 3/2017 | Kim et al. |
| 9,620,612 B2 | 4/2017 | Xu et al. |
| 2017/0162686 A1 | 6/2017 | Arimura |
| 2017/0330802 A1 | 11/2017 | Ok et al. |
| 2019/0067457 A1 | 2/2019 | More et al. |
| 2019/0148237 A1* | 5/2019 | Wang ................ H01L 21/28088 257/288 |
| 2020/0259018 A1* | 8/2020 | Rami .................. H01L 29/7856 |
| 2020/0381520 A1* | 12/2020 | Ando ................ H01L 29/42368 |
| 2020/0411662 A1* | 12/2020 | Lin ......................... C23C 16/56 |

* cited by examiner

FINFET DEVICE WITH PARTIAL INTERFACE DIPOLE FORMATION FOR REDUCTION OF GATE INDUCED DRAIN LEAKAGE

BACKGROUND

This disclosure generally relates to semiconductor fabrication techniques and, in particular, techniques for fabricating FET (field effect transistor) devices.

As semiconductor manufacturing technologies continue to evolve toward smaller design rules and higher integration densities, integrated circuit devices and components become increasingly smaller, creating challenges in layout formation and device optimization. Currently, FinFET technologies are typically implemented for FET fabrication, as such technologies provide effective complementary metal-oxide-semiconductor (CMOS) scaling solutions for FET fabrication at relatively small technology nodes. A FinFET device comprises a three-dimensional fin-shaped FET structure which includes at least one vertical semiconductor fin structure formed on a substrate, a gate structure formed over a portion of the vertical semiconductor fin, and source/drain regions formed from portions of the vertical semiconductor fin which extend from both sides of the gate structure. The portion of the vertical semiconductor fin that is covered by the gate structure between the source and drain regions comprises a channel region of the FinFET device.

Current FinFET devices experience gate leakages including gate to channel, gate to source or drain, and gate induced drain leakage (GIDL). GIDL increases as the electrical gate dielectric thickness $T_{INV}$ is scaled in state-of-the-art CMOS technology. One main contributor to GIDL is band-to-band tunneling which increases for higher mobile channels incorporating SiGe or III-V due to a narrower bandgap. Substrate engineering including optimizing doping concentration and drain profiling mitigates GIDL, but this approach is difficult to implement in a FinFET device which relies on dopant diffusion from an epitaxially grown drain.

SUMMARY

In illustrative embodiments, a semiconductor device comprises a semiconductor substrate and a field effect transistor mounted to the semiconductor substrate. The field effect transistor includes a vertical fin defining a longitudinal length along a first axis, a width along a second axis and a vertical height along a third axis. The vertical fin includes source and drain regions separated by a gate region and a gate structure over the gate region. The gate structure includes a dipole layer and a gate electrode layer over the dipole layer. A first longitudinal section of the gate structure includes the dipole layer and a second longitudinal section of the gate structure is devoid of the dipole layer.

In another illustrative embodiment, a method for forming a semiconductor device comprises forming a vertical fin on a semiconductor substrate. The vertical fin includes source and drain regions separated by a gate region. The vertical fin defines a first axis corresponding to a length of the fin, a second axis corresponding to a thickness of the fin and a third axis corresponding to a height of the fin. The method further comprises forming a dipole layer onto a longitudinal segment of the gate region such that a remaining segment of the gate region is devoid of the dipole layer. The method also comprises forming a high-k liner onto the dipole layer and the gate region. The high k-liner is dimensioned to cover the dipole layer and the remaining segment of the gate region. The method further comprises depositing gate electrode material within the cavity over the high-k liner to form a gate structure on the vertical fin adjacent the gate region.

In another illustrative embodiment, a method for forming a semiconductor device comprises forming a vertical fin on a semiconductor substrate. The vertical fin includes source and drain regions separated by a gate region, and defines a first axis corresponding to a length of the fin, a second axis corresponding to a thickness of the fin and a third axis corresponding to a height of the fin. The method further comprises forming a dummy gate adjacent the gate region of the vertical fin. The method also comprises forming a first spacer onto the dummy gate to encompass the dummy gate and forming a second spacer onto the first spacer to encompass the first spacer. The method further comprises removing the dummy gate and a segment of the inner spacer adjacent the source region to define a cavity between the outer spacer and a remaining opposed segment of the inner spacer adjacent the drain region. The method also comprises depositing a dipole layer to at least line the cavity. The method further comprises removing the remaining opposed segment of the inner spacer adjacent the drain region to define a gap within the cavity between the liner and an opposed segment of the outer spacer adjacent the drain region where the gap is devoid of the dipole layer. The method also comprises depositing a high-k liner at least within the inner cavity to cover the dipole layer and line the surface of the vertical fin below the gap. The method further comprises depositing a gate electrode material within the cavity to form a gate structure.

These and other objects, features and advantages of the present disclosure will become apparent from the following detailed description of illustrative embodiments thereof, which is to be read in connection with the accompanying drawings.

DETAILED DESCRIPTION

Illustrative embodiments of the disclosure will now be described with regard to methods for fabricating semiconductor substrates with uniform structural profiles, as well as semiconductor devices comprising one or more FinFETs. Semiconductor fabrication methods for FinFETs according to illustrative embodiments implement a process flow which creates a partial interface dipole for reduction of gate induced drain leakage (GIDL). In some illustrative embodiments, a FinFET includes a gate stack structure which produces an asymmetric threshold voltage along the channel to suppress GIDL. For example, as explained in further detail below, an illustrative process creates a dipole layer adjacent the source side of the FinFET which increases threshold voltage $V_T$ across the FinFET device. The drain side is devoid of the dipole layer. As a result, the oxide field created near the drain is reduced, which mitigates GIDL current at the drain side and increases threshold voltage adjacent the source side of the FinFET.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., film deposition, removal/etching, semiconductor doping, patterning/lithography and annealing steps, are purposefully not described in great detail herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a FinFET device according to illustrative embodiments utilize a variety of individually known physical and chemical processes performed on a semiconductor (e.g., silicon) substrate, some of which are described in the immediately following paragraphs.

In the discussion that follows, the semiconductor structure, which will incorporate one or more FinFET devices, will be referred to as the "semiconductor structure 100" throughout the various stages of fabrication, as represented in all the accompanying drawings. In addition, the following discussion will identify various intermediate stages of fabrication of the semiconductor structure 100. It is to be understood that the intermediate stages are exemplative only. More or less intermediate stages may be implemented in processing the semiconductor structure, and the disclosed stages may be in different order or sequence. In addition, one or more processes may be incorporated within various intermediate stages as described herein, and one or more processes may be implemented in intermediate stages as otherwise described herein.

Figure 1:
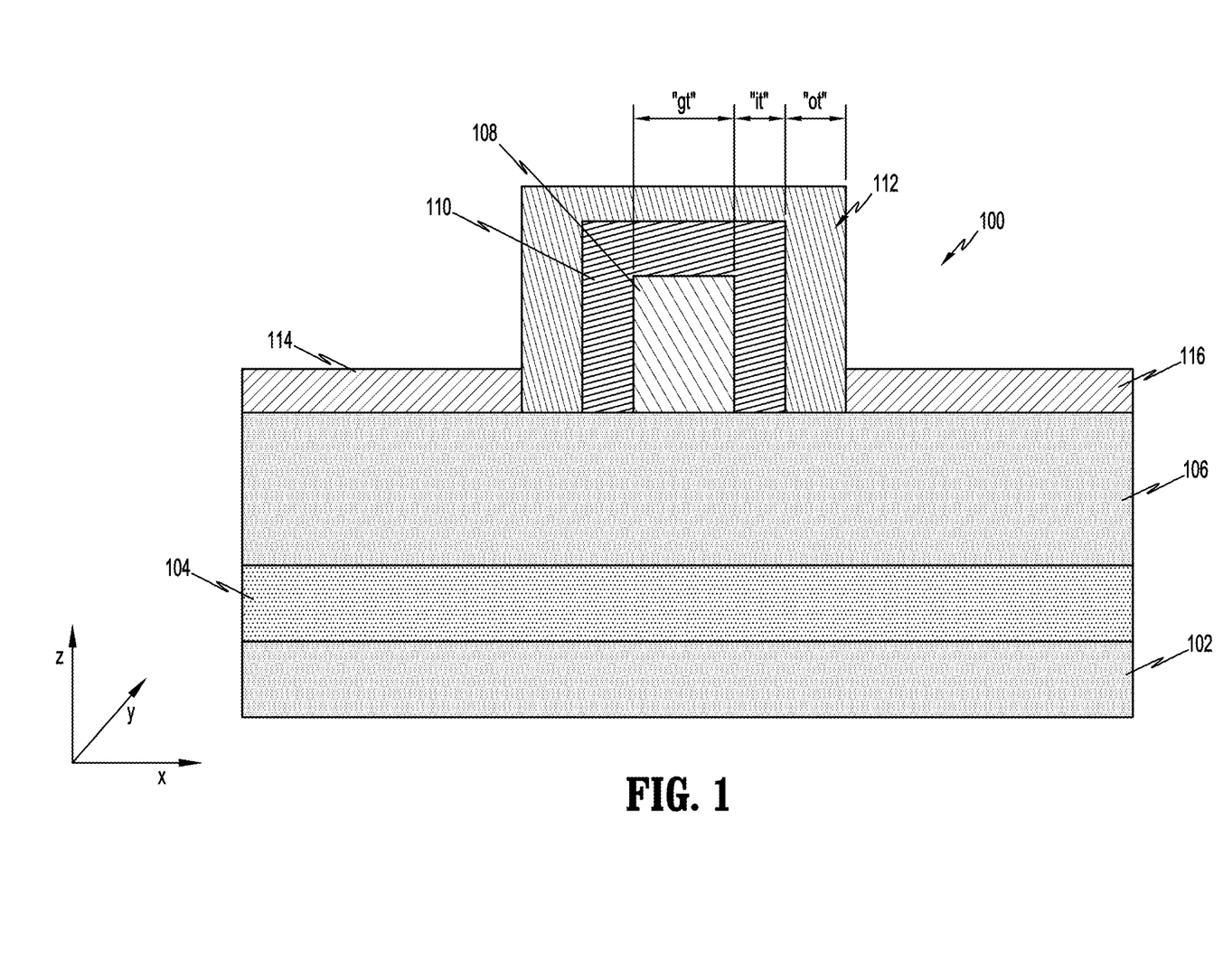
FIG. 1 is a schematic cross-sectional view along the x-axis of a semiconductor structure at a first intermediate stage of fabrication illustrating a semiconductor substrate, a vertical fin extending from the semiconductor structure, source and drain regions, a dummy gate and inner and outer spacers according to one or more illustrative embodiments.

With initial reference to FIG. 1, there is schematically illustrated, in cross-sectional view, a semiconductor structure 100 at an early stage of fabrication. At this stage of fabrication, the semiconductor structure 100 comprises a semiconductor substrate 102, an isolation layer 104, at least one vertical fin 106, a dummy gate 108 extending from the vertical fin 106 and inner and outer spacers 110, 112 disposed over and surrounding the dummy gate 108. The vertical fin 106 defines a longitudinal length along a first or x-axis, a width along a second or y-axis and a vertical height along a third or z-axis. FIG. 1 illustrates a cross-sectional view along the x-axis through the vertical fin 106.

The semiconductor structure 100 shown in FIG. 1 may be fabricated using known semiconductor fabrication techniques and suitable semiconductor materials. For example, the semiconductor substrate 102 is illustrated as a generic substrate layer, and may comprise various structures and layers of semiconductor material. In one embodiment, the semiconductor substrate 102 comprises a bulk semiconductor substrate (e.g., wafer) formed of, e.g., silicon (Si), or other types of semiconductor substrate materials that are commonly used in bulk semiconductor fabrication processes such as germanium (Ge), a silicon-germanium (SiGe) alloy or compound semiconductor materials (e.g., III-V or II-VI, etc.). Non-limiting examples of III-V compound semiconductor materials include gallium arsenide, indium arsenide, indium phosphide and indium gallium phosphide. In another embodiment, the semiconductor substrate 102 comprises a SOI (silicon on insulator) substrate, which comprises an insulating layer (e.g., oxide layer) disposed between a base substrate layer (e.g., silicon substrate) and an active semiconductor layer (e.g., active Si or SiGe layer) in which active circuit components are formed as part of a FEOL (front end of line) structure.

The isolation layer 104 and vertical fin 106 can be fabricated using various methods. For example, for bulk and SOI substrate embodiments, the vertical fin 106 can be formed by patterning an active silicon layer (e.g., crystalline silicon, crystalline SiGe, III-V compound semiconductor material, etc.) at the surface of a bulk semiconductor substrate or the SOI substrate. In one embodiment, the vertical fins 106 may be patterned from a crystalline SiGe layer that is epitaxially grown on top of a bulk silicon substrate or a bulk germanium substrate. A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on a silicon substrate layer. A strained-Si/relaxed-SiGe structure provides a tensile strain which primarily improves electron mobility for n-type FET devices, while a strained-SiGe/relaxed-Si structure provides a compressive strain which primarily improves hole mobility for p-type FET devices.

After forming the vertical fin 106, a layer of insulating material can be deposited to cover the vertical fin, and then planarized (via chemical-mechanical planarization (CMP)) down to the top of the vertical fin, and then further recessed using an etch-back process (e.g., selective Reactive Ion Etch (ME) process) to form an isolation region (not shown) separating the vertical fin 106. In another illustrative embodiment, the vertical fin 106 may be formed using a process in which the isolation layer is first deposited and then etched using RIE or deep RIE to form a trench in the isolation layer down to the semiconductor substrate 102. The vertical fin 106 may be then formed by epitaxially growing crystalline semiconductor material, starting on the exposed surfaces of the semiconductor substrate 102 at the bottom of the trench, using ART (aspect ratio trapping) techniques. ART enables selective epitaxial growth of crystalline Si, SiGe, or III-V compound semiconductor material, for example, to fill high aspect ratio trenches formed in an insulating layer, and thereby form high quality active channel layers for FinFET devices. The crystalline SiGe layer (or other types of epitaxial semiconductor layers) can be epitaxially grown using known techniques, such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques.

With continued reference to FIG. 1, the dummy gate 108 is fabricated using known process flows (e.g., by sequentially forming a dummy oxide layer and polysilicon layer and/or a polysilicon germanium over the substrate and patterning the layers to form the structure of the dummy gate structure). The dummy gate surrounds the gate region of the vertical fin 106, i.e., it encapsulates the top and vertical sides of the fin 106. Thereafter, the inner spacer 110 is formed by depositing one or more layers of an oxide material such as silicon oxide (SiO$_2$), hydrogenated silicon carbon oxide (SiCOH) or other suitable low-k dielectric materials. The one or more layers of dielectric material can be deposited using plasma-enhanced chemical vapor deposition (PECVD), atomic layer deposition (ALD), or other suitable deposition methods which enable the deposition of thin films of dielectric material with high conformality. The process is thereafter continued by forming an outer spacer 112 over the inner spacer 110. The outer spacer 112 may include silicon nitride (SiN) and may be fabricated via any of the aforementioned processing techniques described in connection with formation of the inner spacer 110. In illustrative embodiments, the thickness of the dummy gate "gt" ranges from about 8 nanometers to about 12 nanometers (nm), or is about 10 nanometers (nm). The thickness of the wall of the inner spacer "it" may range from about 4 nanometers (nm) to about 6 nanometers (nm), or is about 5 nanometers (nm), and the thickness of the wall of the outer spacer "ot" may range from about 5 nanometers (nm) to about 7 nanometers (nm), or is about 6 nanometers (nm). Other dimensions for each of the dummy gate, the inner spacer and the outer spacer are also contemplated.

Thus, in the illustrative embodiment, two spacers, i.e., the inner and outer spacers 110, 112 are formed around the dummy gate 108 as opposed to one spacer as in conventional methodologies. In addition, the thickness of the dummy gate "gt" is less than conventional methodologies, and typically would also encompass the area or thickness of the inner spacer "it."

With continued reference to FIG. 1, the semiconductor structure 100 further includes source and drain regions 114, 116 on respective sides of the dummy gate 108 with the gate region of the vertical fin 106 generally defined between the source and drain regions 114, 116. In one illustrative embodiment, the source and drain regions 114, 116 are formed by growing epitaxial semiconductor material on the exposed surfaces of the vertical fin 106 adjacent to the dummy gate 108 and the inner and outer spacers 110, 112. The type of epitaxial material and doping used to form the source or drain regions 114, 116 will vary depending on whether the contemplated FinFET device is pFET or an nFET device. For example, for an nFET device, the source and drain regions 114, 116 may comprise an n-doped epitaxial silicon (Si) material, and for a pFET device, the source and drain regions 114, 116 may comprise a p-doped epitaxial silicon-germanium (SiGe) layer. In another embodiment, the source and drain regions 114, 116 include silicide layers that are formed on tops or upper surfaces of the source and drain regions 114, 116 using known methods. In other illustrative embodiments, the source and drain regions 114, 116 may be formed via an ion implantation process(es). In one illustrative embodiment, the source and drain regions 114, 116 may comprise N-type or P-type dopant atoms, formed by introducing dopant atoms via conventional methodologies Referring now to FIG. 2, in a next or second intermediate stage of fabrication, an interlayer dielectric (ILD) layer 118 is formed by depositing one or more layers of insulating material over the surface of the semiconductor substrate 102 to cover the dummy gate 108 and the inner and outer spacers 110, 112. The ILD layer 118 is planarized down via a chemical-mechanical planarization (CMP) process to a level to remove the upper segments of the inner and outer spacers 110, 112 and expose the upper surface of the dummy gate 108 as shown. The ILD layer 118 can be formed using any suitable dielectric materials including, but not limited to, silicon oxide (SiO$_2$), hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). For example, the ILD layer 118 may comprise a single deposited layer of insulating material, or multiple layers of insulating material (e.g., a first layer of a flowable oxide and a second layer of insulating material formed on the first layer). The dielectric material of the ILD layer 118 may be deposited using known deposition techniques, such as, for example, ALD (atomic layer deposition), CVD (chemical vapor deposition) PECVD (plasma-enhanced CVD), or PVD (physical vapor deposition), or spin-on deposition, or other deposition techniques that are suitable to form low-k dielectric layers.

Figure 2:
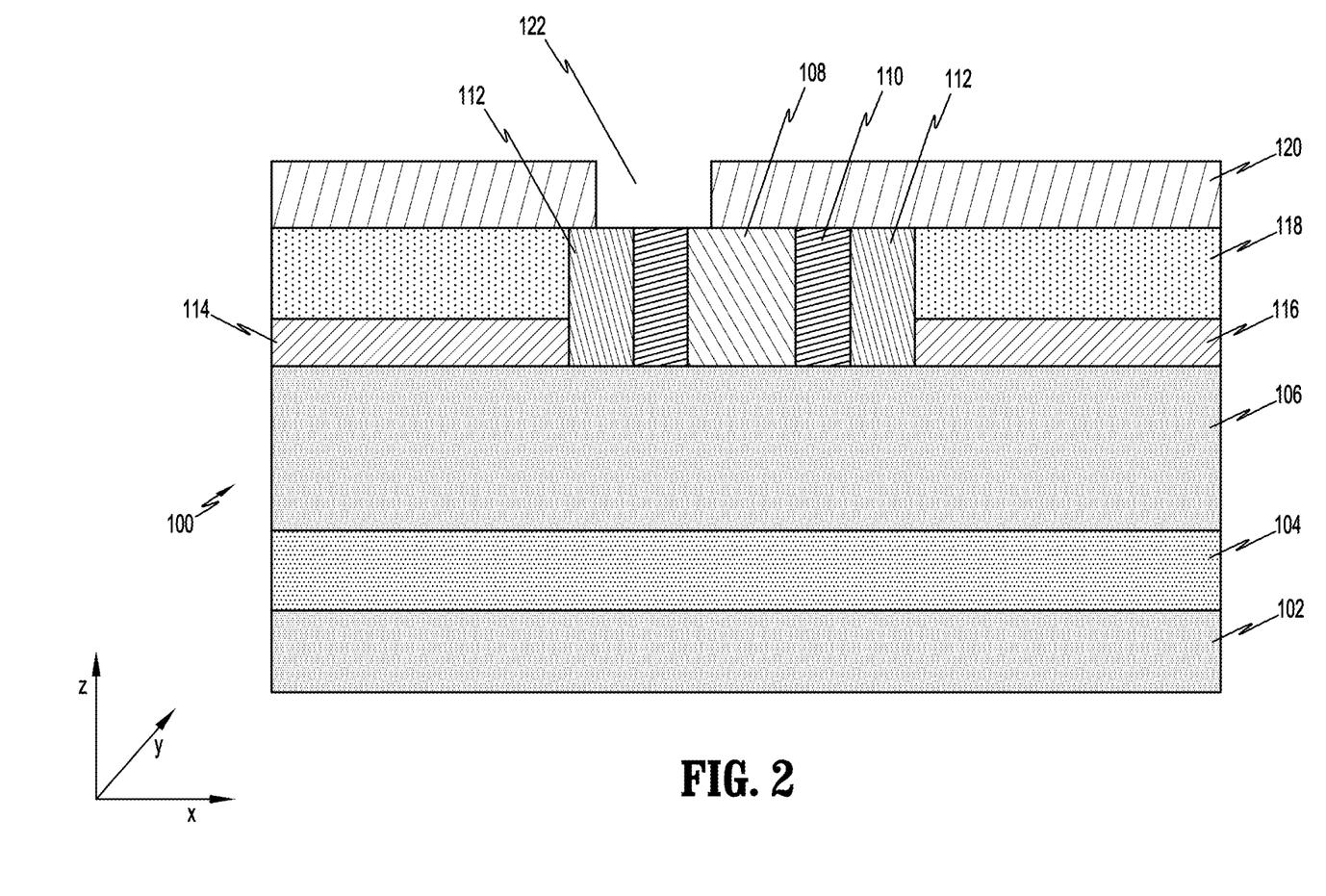
FIG. 2 is a schematic cross-sectional view along the x-axis of the semiconductor structure at a second intermediate stage of fabrication illustrating an interlayer dielectric deposited onto the vertical fin and a lithographic mask defining a patterned opening exposing the inner spacer and the dummy gate according to one or more illustrative embodiments.

With continued reference to FIG. 2, at least one lithographic mask, generally identified by reference numeral 120, is applied over the semiconductor structure. The mask 120 may include a tri layer stack having a photoresist, an anti-reflective coating underlying the photoresist and an organic planarization layer (OPL) beneath the coating. The organic planarization layer (OPL) may be deposited from solution, e.g., by any conventional deposition process. The mask 120 is patterned to define a patterned opening 122 which exposes one wall segment of the inner spacer 110 and a portion of the wall of the outer spacer 112 adjacent to, in this illustrative embodiment, the source region 114 of the semiconductor structure 100. The opening 122 also exposes a portion of the dummy gate 108. The opening 122 of the mask 120 may range from between about 10 nanometers (nm) to about 12 nanometers (nm) although other dimensioned are envisioned. Two masks may also be utilized. In illustrative embodiments, about fifty (50) % to about seventy (70) % of the thickness of the wall of the outer spacer 112 is exposed and about fifteen (15) to about forty (40) % of the top of the dummy gate 108 is exposed through the opening 122 of the mask 120. Other dimensions are also contemplated.

Figures 3, 4:
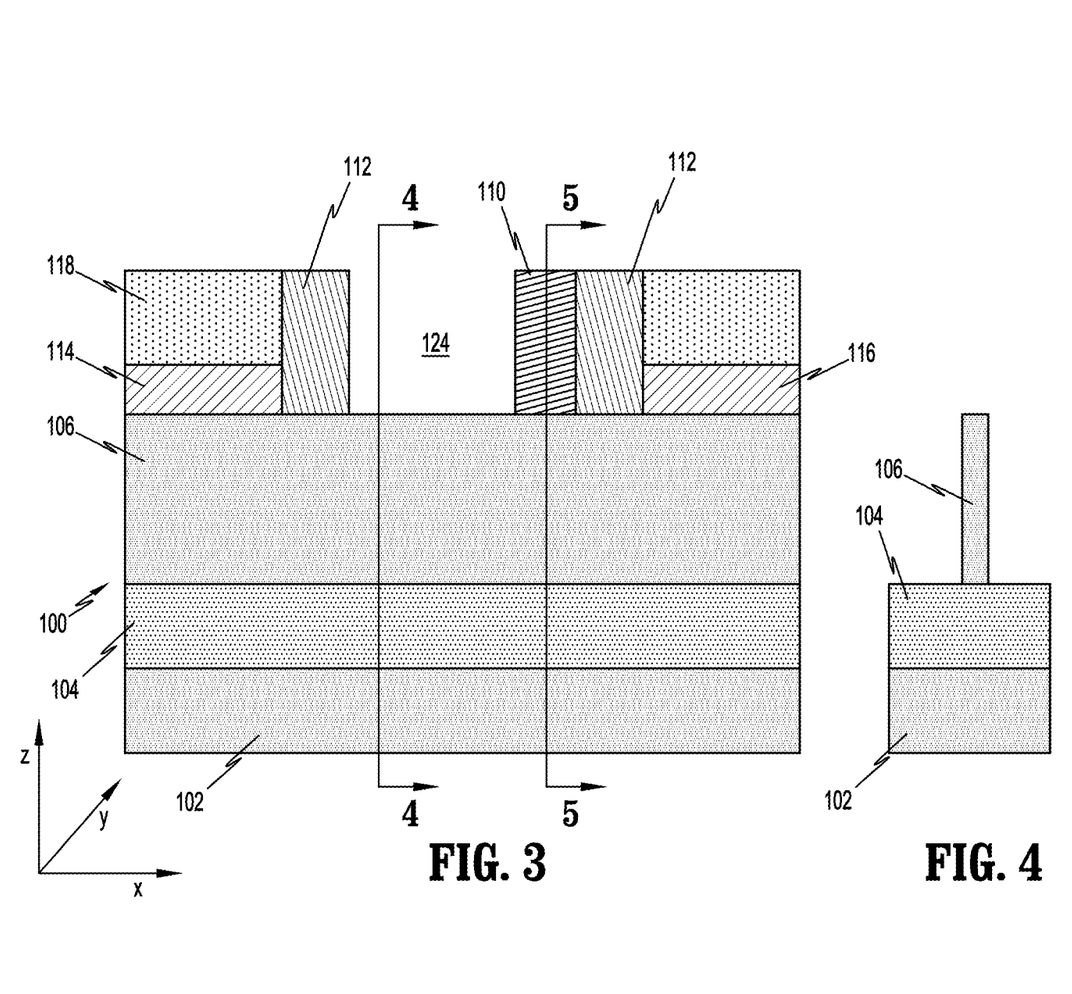
FIG. 3 is a schematic cross-sectional view along the x-axis of the semiconductor structure at a third intermediate stage of fabrication illustrating the dummy gate and a wall segment of the inner spacer removed according to one or more illustrative embodiments.
FIG. 4 is a schematic cross-sectional view along the lines 4-4 of FIG. 3 illustrating a first longitudinal segment of the vertical fin devoid of the inner spacer according to one or more illustrative embodiments.
Figure 5:
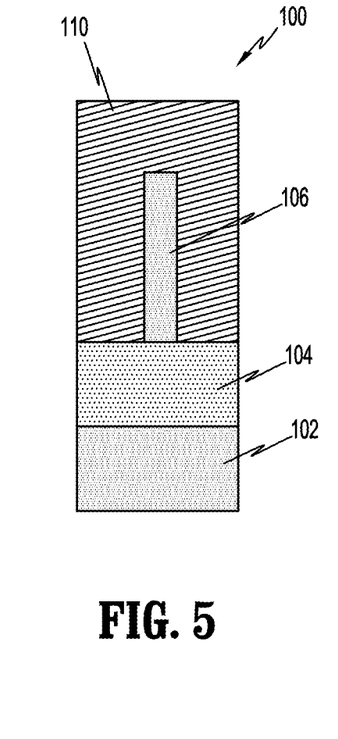
FIG. 5 is a schematic cross-sectional view along the lines 5-5 of FIG. 3 illustrating a second longitudinal segment the vertical fin including the inner spacer according to one or more illustrative embodiments.

With reference to FIGS. 3-5, in a next or third intermediate stage of fabrication, the material, for example, the silicon oxide of the exposed wall segment of the inner spacer 110, is selectively etched through the opening 122 in the mask 120. Any suitable etching process may be utilized including a wet etch process and/or a dry etch process such as RIE (reactive ion etching or plasma etching). The etching sequence for the silicon oxide material may include a wet etching process such as HF etching, for example, HF (hydrofluoric acid) or buffered HF. Once the exposed wall of the inner spacer 110 is removed, a chemistry change is needed to remove the dummy gate 108. For example, the etching process or etchant is then changed to, for example, a process including an ammonia etchant and the material of the dummy gate 108, for example, polysilicon and/or polysilicon germanium, is selectively etched and removed. In the alternative, the dummy gate 108 may be removed prior to removal of the wall of the inner spacer 110. Both etching processes may be selective to the material forming the outer spacer 112 whereby the outer spacer 112 remains intact. FIG. 4 illustrates the removal of the wall segment of the inner spacer 110 at a first longitudinal segment of the gate region and FIG. 5 illustrates the remaining wall segment of the inner spacer 110 adjacent the drain region 116 still intact at a second longitudinal segment of the gate region. The mask 120 may be removed. Subsequent to the removal of the wall segment of the inner spacer 110 and the dummy gate 108, a cavity 124 is formed between the remaining wall segment of the inner spacer and the opposed outer wall of the outer spacer 112 as shown in FIG. 3.

Figure 6:
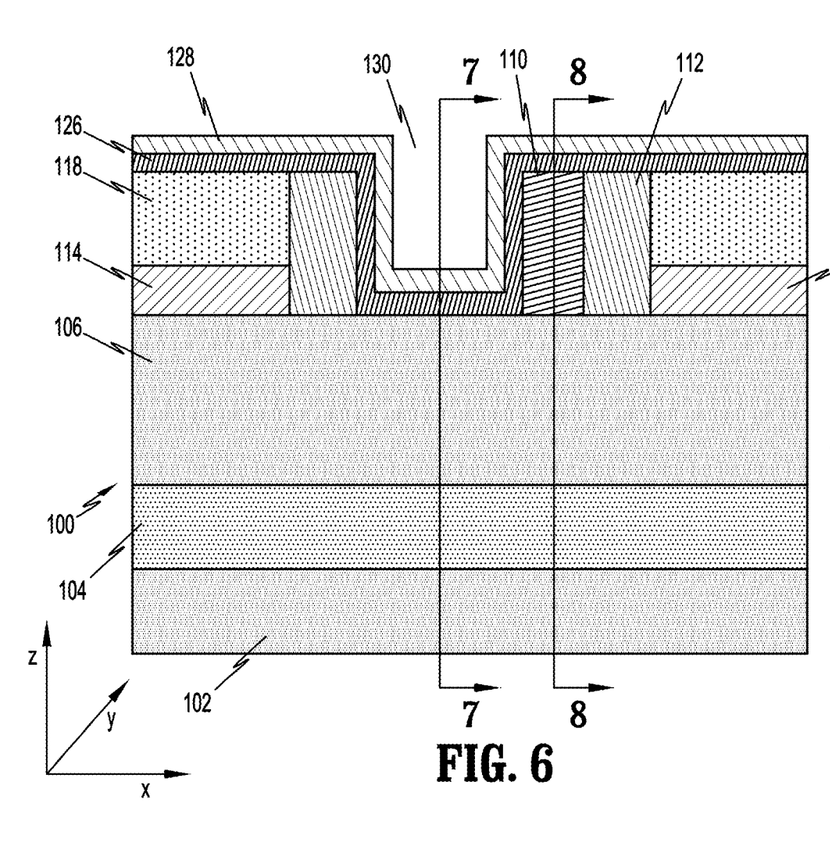
FIG. 6 is a schematic cross-sectional view along the x-axis of the semiconductor structure at a fourth intermediate stage of fabrication illustrating deposition of a dipole layer and a protective layer onto the semiconductor structure according to one or more illustrative embodiments.
Figure 7:
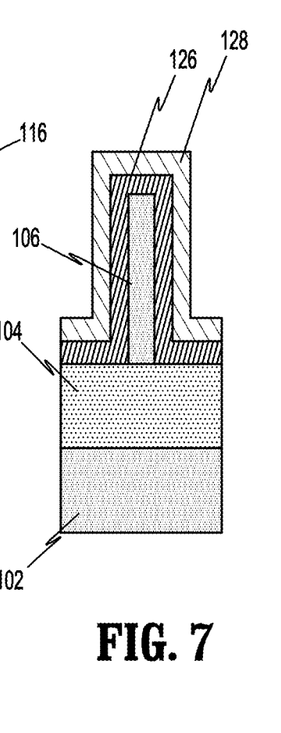
FIG. 7 is a schematic cross-sectional view along the lines 7-7 of FIG. 6 according to one or more illustrative embodiments.
Figure 8:
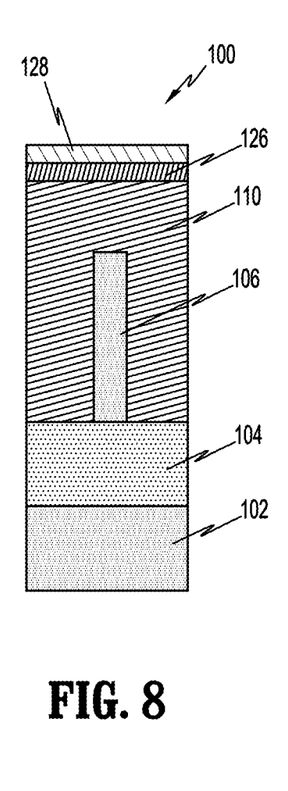
FIG. 8 is a schematic cross-sectional view along the lines 8-8 of FIG. 6 according to one or more illustrative embodiments.

Referring now to FIGS. 6-8, the next or fourth intermediate stage of the process includes depositing a first or dipole layer 126 of dielectric material into the cavity 124, and also along the top and sides of the vertical fin 106. The dipole layer 126 is an insulating dipole layer and may include any suitable material such as an aluminum oxide ($Al_2O_3$) if the semiconductor structure 100 is to be an nFET, or an oxide of Group IIA or IIIB elements, such as lanthanum oxide ($La_2O_3$) if the semiconductor structure 100 is to be an pFET. Thereafter, a protective layer 128 comprising a metal such as, for example, titanium nitride (TiN) or a titanium aluminum nitride (TiAlN) and/or combinations thereof, is deposited to encapsulate the dipole layer 126. The protective layer 128 of metal may be deposited using a suitable deposition process, e.g., CVD, plasma-enhanced chemical vapor deposition (PECVD), PVD, plating, thermal or e-beam evaporation, sputtering, etc. Subsequent to deposition of the dipole layer 126 and the protective layer 128, a cavity 130 remains defined between the outer wall and the remaining inner wall segment of the inner spacer 110. FIGS. 7 and 8 are cross-sections along respective lines 7-7 and 8-8 of FIG. 6 and illustrate the first and second longitudinal sections of the gate region with the wall of the inner spacer 110 still intact at the second longitudinal section.

Figure 9:
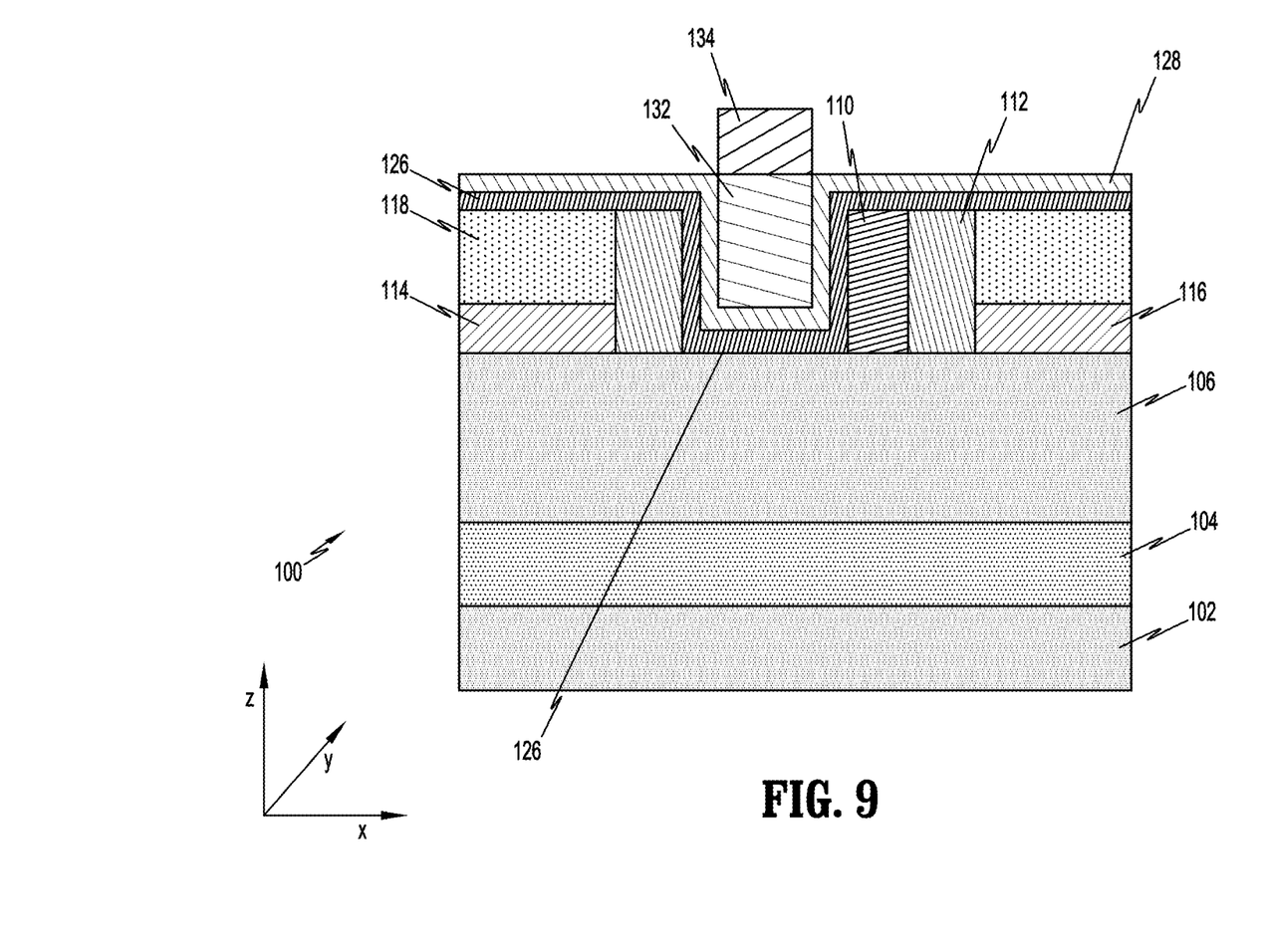
FIG. 9 is a schematic cross-sectional view along the x-axis of the semiconductor structure at a fifth intermediate stage of fabrication illustrating deposition of a sacrificial material into the cavity and a protective mask over the sacrificial material according to one or more illustrative embodiments.

With reference now to FIG. 9, the process is continued at a fifth intermediate stage by depositing a sacrificial OPL fill 132, e.g., an organic planarization layer (OPL), onto the semiconductor structure 100 to fill the cavity 130 (FIG. 6) defined within the boundary of the protective layer 128. The organic planarization layer (OPL) is deposited from solution, e.g., by any conventional deposition process, discussed hereinabove. The sacrificial OPL fill 132 will fill the cavity and extend above the upper surfaces of the inner and outer spacers 110, 112. A CMP process may be optionally utilized to planarize the OPL. Thereafter, a lithographic mask 134 may be placed on the semiconductor structure and patterned to cover the sacrificial OPL fill 132 and expose the remaining upper and side surfaces of the protective layer 128 and the dipole layer 126.

Figures 10, 11:
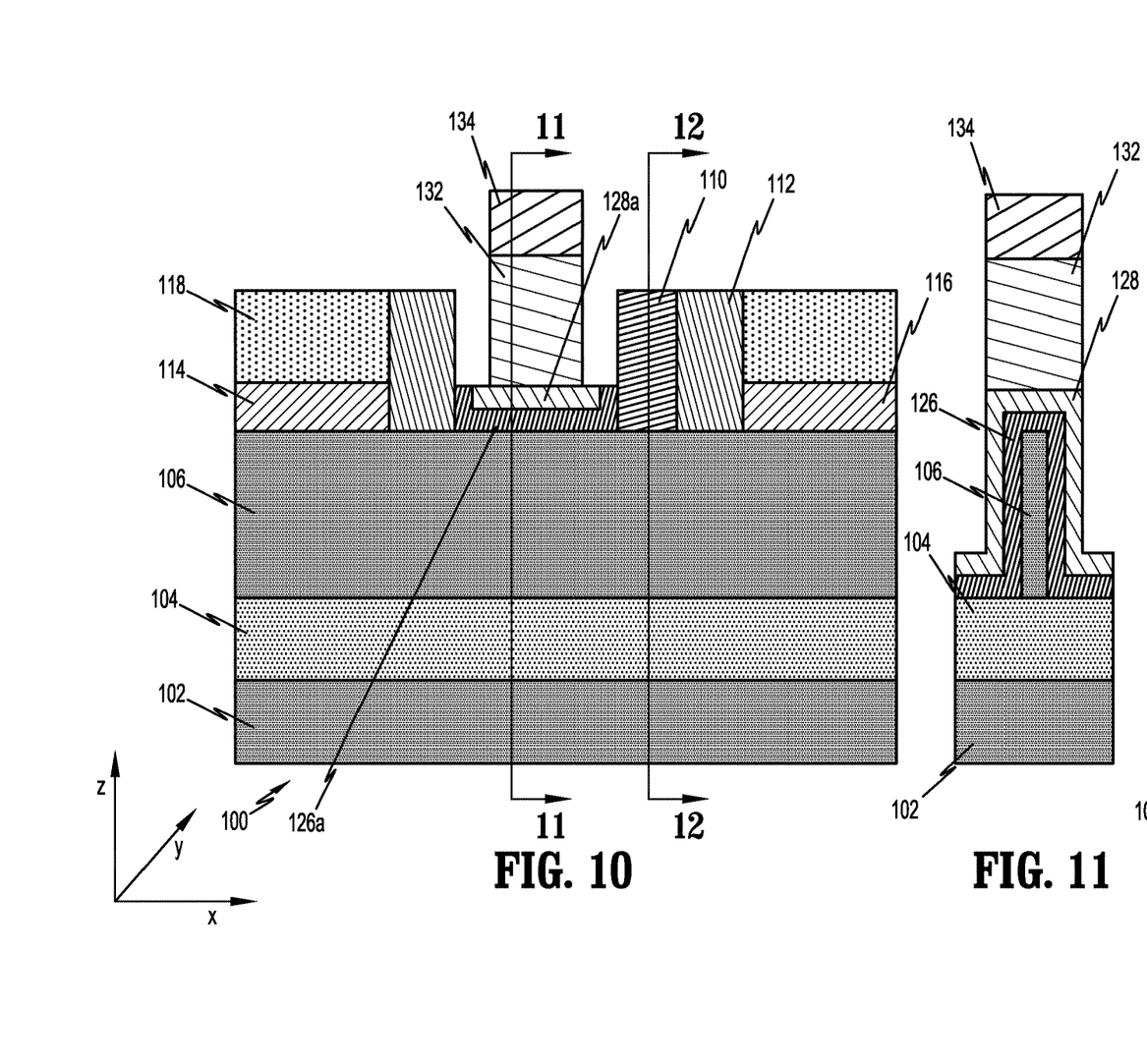
FIG. 10 is a schematic cross-sectional view along the x-axis of the semiconductor structure at a sixth intermediate stage of fabrication illustrating removal of portions of the protective layer and the dipole layer according to one or more illustrative embodiments.
FIG. 11 is a schematic cross-sectional view along the lines 11-11 of FIG. 10 illustrating the remaining segments of the protective layer and the dipole layer intact below the protective mask and the sacrificial material according to one or more illustrative embodiments.
Figure 12:
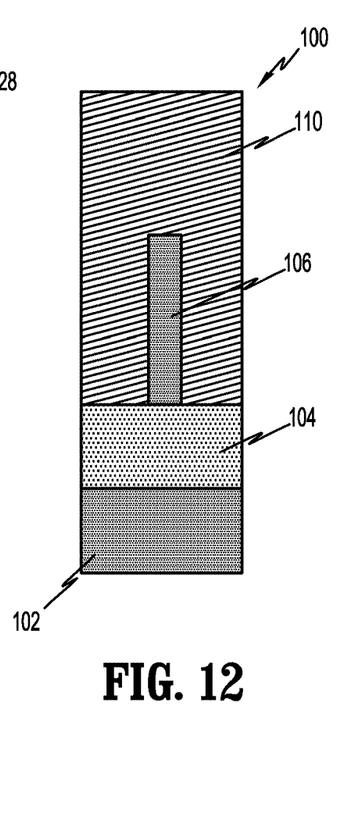
FIG. 12 is a schematic cross-sectional view along the lines 12-12 of FIG. 10 illustrating the reniaining segment of the inner spacer adjacent the drain region according to one or more illustrative embodiments.

With reference to FIGS. 10-12, through any of the aforementioned conventional etching processes, the exposed protective layer 128 and the dipole layer 126 are etched to remove the exposed materials with the exception of the segments of the protective layer 128 and the dipole layer 126 underlying the OPL fill 132 and the mask 134. More specifically, subsequent to the one or more etching processes, respective segments 126a, 128a of the dipole layer 126 and the protective layer 128 beneath the OPL fill 132 and the mask 134 remain intact as shown in FIG. 10. The dipole layer 126 and the protective layer 128 still envelope or enclose the vertical fin 106. The exposed protective layer 128 and the dipole layer 126 can be recessed using conventional wet or dry etch process.

Figures 13, 14:
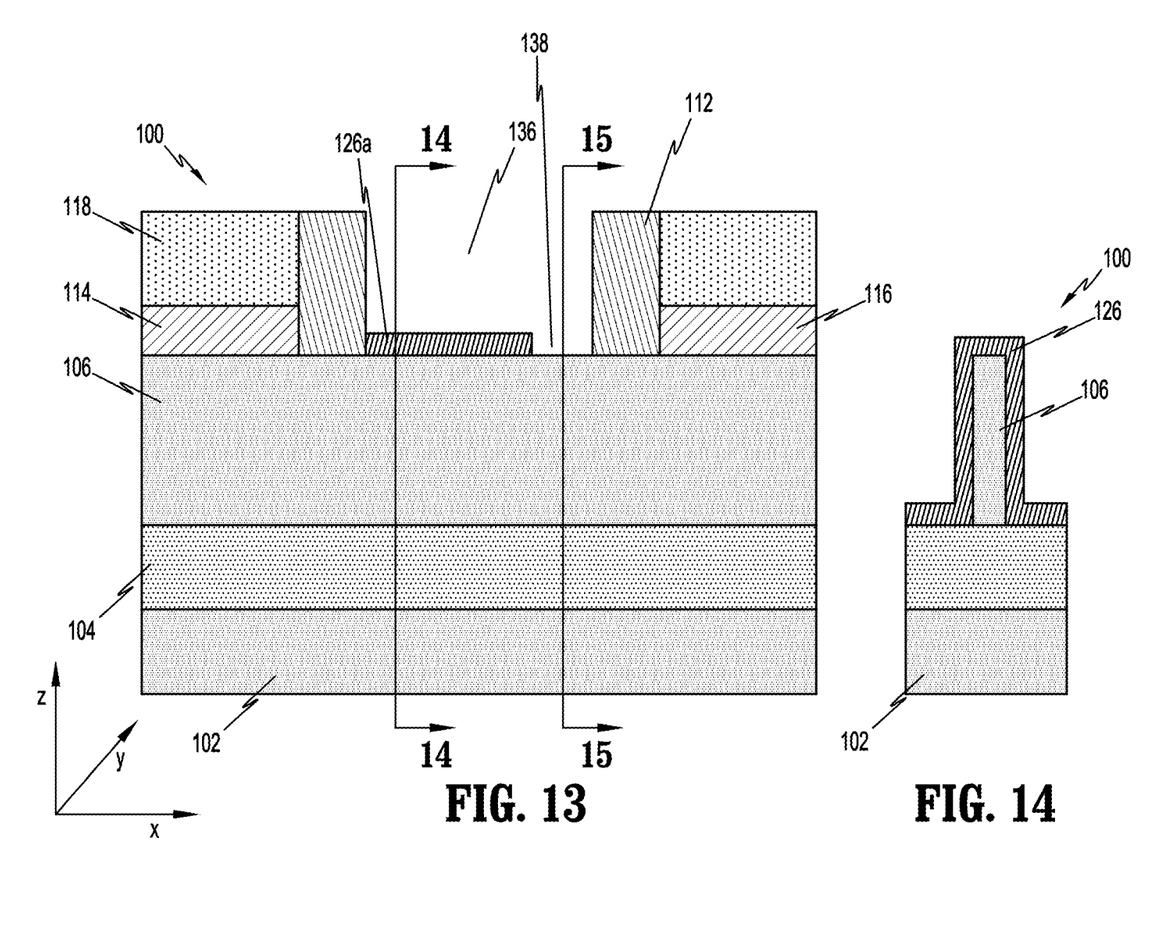
FIG. 13 is a schematic cross-sectional view along the x-axis of the semiconductor structure at a seventh intermediate stage of fabrication illustrating removal of the protective mask, sacrificial material and the remaining segment of the inner spacer leaving the dipole layer on the first longitudinal segment of the gate region according to one or more illustrative embodiments.
FIG. 14 is a schematic cross-sectional view along the lines 14-14 of FIG. 13 illustrating the dipole layer on the first longitudinal segment of the gate region according to one or more illustrative embodiments.
Figure 15:
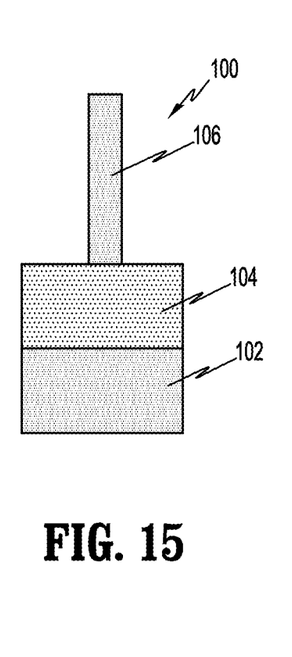
FIG. 15 is a schematic cross-sectional view along the lines 15-15 of FIG. 13 illustrating, the second longitudinal segment of the gate region devoid of the dipole layer according to one or more illustrative embodiments.

Referring now to FIGS. 13-15, the OPL fill 132, the mask 134 and the remaining segments of the inner spacer 110 and the protective layer 128 are removed through one or more suitable etching or removal processes including a wet etch. In other illustrative embodiments, the inner spacer 110 may be removed before the removal of the protective layer 128 as previously described. The removal agent utilized will depend on the selected material for the inner spacer 110. The OPL fill 132 may be removed via an ash etching and/or stripping process. The etching material can be an $N_2/H_2$, or $CO/CO_2$ ash or a nitrogen or hydrogen-based chemistry including, for example, nitrogen gas or hydrogen gas, or a combination thereof. The removal of the inner spacer 110 and the OPL fill 132 defines a cavity 136 within the wall of the outer spacer 112. In addition, subsequent to the one or more removal processes, the dipole segment 126a remains on the top or upper surface of the vertical fin 106. At one end adjacent the source region 114, the dipole segment 126a may be in contacting relation with the wall of the outer spacer 112. At the other end adjacent the drain region 116, the dipole segment 126a is spaced from the outer spacer 112 to define a gap 138 between the dipole segment 126a and the outer wall of the outer spacer 112. The dipole segment 126a extends along the top and sides of the vertical fin 106 within a first longitudinal section of the gate region as shown in FIG. 14 and is removed at a second longitudinal section of the gate region as shown in FIG. 15. The size of the gap corresponds to the thickness of the removed wall of the inner spacer 110, i.e., ranging from about 4 nanometers (nm) to about 6 nanometers (nm), or about 5 nanometers (nm). Thus, a portion of the length of the vertical fin 106, i.e., adjacent the drain region 116 is devoid of the dipole material as defined by the gap 138 (FIG. 15). The significance of the gap 138 will be discussed in detail hereinbelow.

Figures 16, 17:
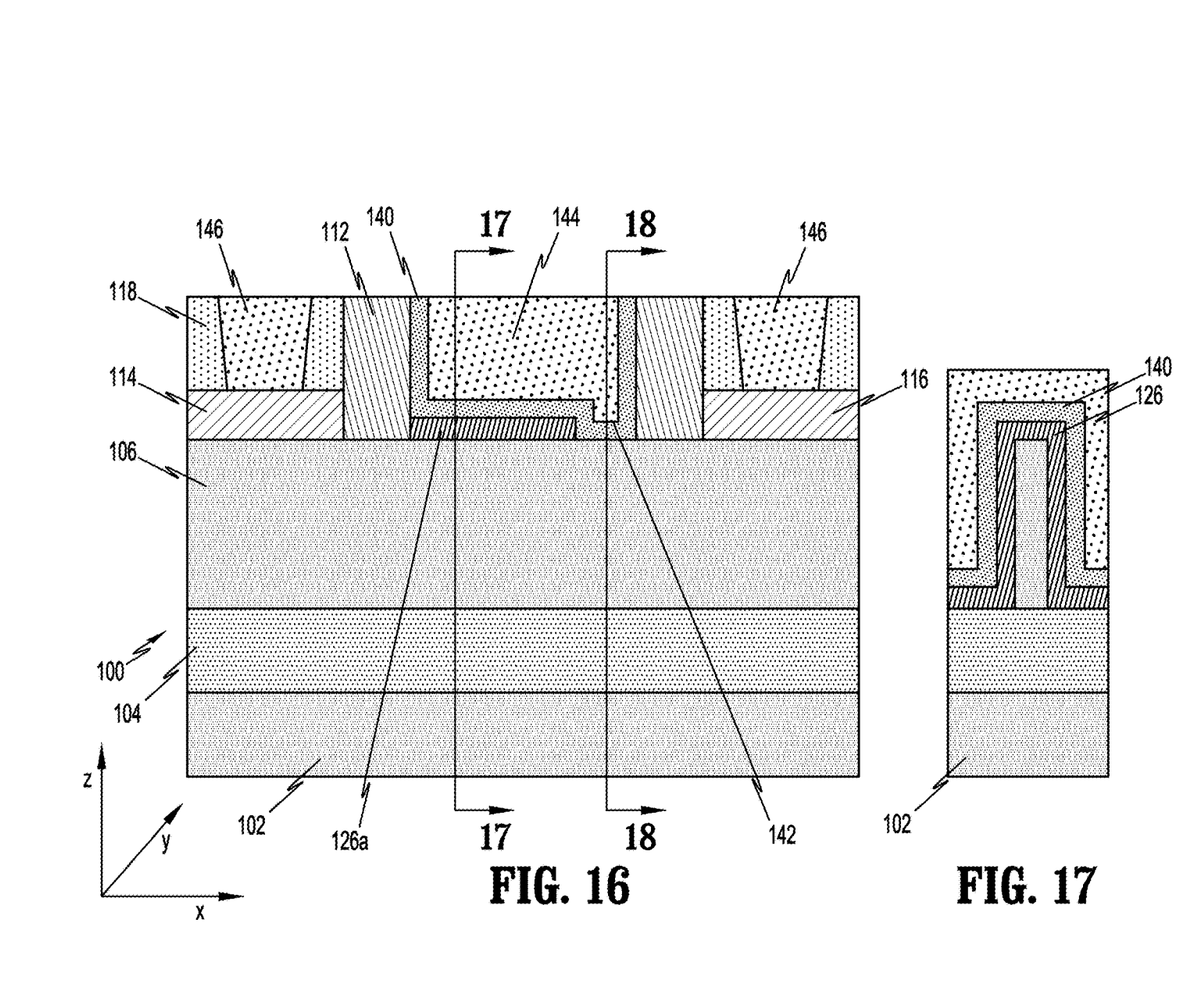
FIG. 16 is a schematic cross-sectional view along the x-axis of the semiconductor structure at an eighth intermediate stage of fabrication illustrating formation of the gate structure and contacts according to one or more illustrative embodiments.
FIG. 17 is a schematic cross-sectional view along the lines 17-17 of FIG, 16 illustrating the first longitudinal segment of the gate structure with the dipole layer according to one or more illustrative embodiments.
Figure 18:
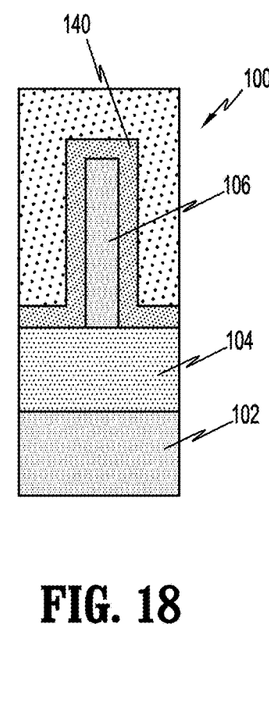
FIG. 18 is a schematic cross-sectional view along the lines 18-18 of FIG. 17 illustrating the second longitudinal segment of the gate structure devoid of the dipole layer according to one or more illustrative embodiments.

Referring now to FIGS. 16-18, the process is continued through deposition of a gate dielectric layer, e.g., a conformal high-k liner 140 onto the semiconductor structure 100, i.e., within the remaining cavity 136 defined between the wall of the outer spacer 112 and on the dipole segment 126a and the remainder of the top and sides of the vertical fin 106. The high-k liner 140 may comprise a high-k dielectric material having a dielectric constant of about 3.9 or greater. In illustrative embodiments, the high-k liner 140 includes, but is not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k liner 140 may further include dopants such as lanthanum, aluminum. In one embodiment of the disclosure, the conformal high-k liner 140 is formed with a thickness in a range of about 0.5 nm to about 2.5 nm, which will vary depending on the target application. The high-k liner 140 is deposited using known methods such as atomic layer deposition (ALD), e.g., which allows for high conformality of the gate dielectric material.

As best depicted in FIGS. 16 and 18, the gap 138 (FIG. 13) between the dipole segment 126a and the wall of the outer spacer 112 defines an area 142 (corresponding to, e.g., the length of the second longitudinal section of the vertical fin 106 which is devoid of the dipole material. In illustrative embodiments, this area may range between about 15% to about 35% of the length of the channel defined between the outer spacer 112. The exclusion of the dipole material decreases the threshold voltage $V_T$ near the drain region 116. This enhances performance characteristics, minimizes leakage and improves power of the semiconductor structure, e.g., a FinFET device, while not affecting the threshold voltages of the device as they are defined on the source side.

Referring still to FIGS. 16-18, a gate metal 144 is deposited onto the semiconductor structure 100, i.e., over the high-k liner 140 to fill the cavity 136 defined between the wall of the outer spacer 112 and cover the top and sides of the vertical fin 106. The gate metal 144 may be formed by depositing a conductive material including, but not limited to titanium nitride (TiN), titanium aluminum nitride (TiAlN) and/or combinations thereof. Other suitable materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. In embodiments, the gate metal 144 includes one or more of TiN, TiAlC or combinations thereof. The gate metal 144 may further comprise dopants that are incorporated during or after deposition. The gate metal 144 is deposited using a suitable deposition process, e.g., CVD, plasma-enhanced chemical vapor deposition (PECVD), PVD, plating, thermal or e-beam evaporation, sputtering, etc. A high temperature anneal may be performed. The high-k liner 140 and the gate metal 144 form the replacement gate electrode structure.

In another embodiment, a thin conformal layer of work function metal (WFM) may be deposited over the conformal layer of high-k liner 140 prior to depositing the gate metal. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of vertical FET devices that are to be formed. The conformal WFM layer is deposited using known methods such as ALD, CVD, etc. In one embodiment, the conformal WFM layer is formed with a thickness in a range of about 2 nm to about 5 nm.

Following the formation of the metallic gate structure, any suitable sequence of processing steps can be implemented to complete the fabrication of the semiconductor structure 100, the details of which are not needed to understand embodiments of the invention. For example, a MOL (middle of the line) process is performed to form conductive via contacts in the ILD layer 118 (and one or more other layers of insulating material that may be formed over the ILD layer 118). The via contacts 146 are formed by etching openings in the ILD layer 118 (and any overlying insulating layer) down to the source and drain regions 114, 116, and then filling the openings with a conductive material to form the contacts in the ILD layer 118. Following formation of the MOL device contacts, a BEOL (back end of line) interconnect structure is formed using well known fabrication process flows to provide connections between the FinFET devices and other active or passive devices that are formed as part of the FEOL layer.

Thus, the semiconductor structure 100, e.g., including a FinFET device includes a gate structure having a first longitudinal section along the x-axis with a dipole layer 126 and a second longitudinal section adjacent the drain region 116 devoid of the dipole layer 126. As noted above, these features enable reduced GIDL while not changing the threshold voltage of the FinFET.

While exemplary methods are discussed herein in the context of FinFET devices, those of ordinary skill in the art can readily envision the implementation of the same or similar methods to form overlapping source/drain and gate contacts for planar FET devices having metal gate structures. Further, it is to be understood that the methods discussed herein for fabricating FinFET devices with gate contacts formed in active regions overlapping source/drain contacts can be incorporated as part of various semiconductor processing flows for fabricating other types of semiconductor devices and integrated circuits with various analog and digital circuitry or mixed-signal circuitry. The integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

We claim:

1. A semiconductor device, comprising:
one or more field effect transistors disposed on a semiconductor substrate, wherein at least one of the one or more field effect transistors comprises:
a vertical fin disposed on the semiconductor substrate and defining a longitudinal axis;
a source region and a drain region adjacent respective opposed ends of the vertical fin;
a dipole layer disposed on the vertical fin;
an electrode structure disposed between the source region and the drain region arranged about the vertical fin, the electrode structure including:
a dielectric liner disposed on the dipole layer and the vertical fin; and
a gate metal disposed on the dielectric liner;
wherein a first longitudinal section of the electrode structure is in contact with the dipole layer; and
wherein a second longitudinal section of the electrode structure is in contact with the vertical fin and devoid of the dipole layer;
a first outer spacer disposed between the source region and the electrode structure; and
a second outer spacer disposed between the drain region and the electrode structure;

wherein the dipole layer includes a first end in contact with the first outer spacer and a second end spaced from the second outer spacer.

2. The semiconductor device of claim 1 wherein the second longitudinal section of the electrode structure extends between about 10% to about 50% of a longitudinal length of the electrode structure.

3. The semiconductor device of claim 1 wherein the dipole layer includes at least one of the following:
one of an aluminum oxide and a titanium oxide as a component of an nFET structure; and
one or more oxides of Group IIA or IIIM elements as a component of a pFET structure.

4. The semiconductor device of claim 1 wherein the first end of the dipole layer is disposed adjacent the source region and the second end of the dipole layer is disposed adjacent the drain region.

5. A semiconductor device, comprising:
a semiconductor substrate; and
a field effect transistor disposed on the semiconductor substrate, the field effect transistor including:
a vertical fin defining a longitudinal axis;
source and drain regions;
an outer spacer disposed on the vertical fin between the source and drain regions;
a dipole layer disposed on the vertical fin and at least partially extending within the outer spacer, the dipole layer including a first end adjacent the source region and a second end adjacent the drain region, the second end being spaced from the outer spacer, wherein the first end of the dipole layer is in contact with the outer spacer;
a gate structure disposed over the vertical fin within the outer spacer, the gate structure including:
a dielectric liner including a first liner segment disposed on the dipole layer and a second liner segment disposed on the vertical fin; and
a gate metal disposed on the dielectric liner.

6. The semiconductor device of claim 5 wherein the field effect transistor is an nFET and wherein the dipole layer includes one of an aluminum oxide and a titanium oxide.

7. The semiconductor device of claim 5 wherein the field effect transistor is a pFET and wherein the dipole layer includes oxides of Group IIA or IIIB elements.

8. The semiconductor device of claim 5 including a contact in communication with each of the source and drain regions.

9. The semiconductor device of claim 5 wherein a first longitudinal section of the gate structure is in contact with the dipole layer and wherein a second longitudinal section of the gate structure is in contact with the vertical fin.

10. The semiconductor device of claim 9 wherein the second longitudinal section of the gate structure extends between about 10% to about 50% of a longitudinal length of the gate structure.

11. The semiconductor device of claim 10 wherein the second longitudinal section of the gate structure extends about 25% of the longitudinal length of the gate structure.

12. A semiconductor device, comprising:
a semiconductor substrate; and
a field effect transistor disposed on the semiconductor substrate, the field effect transistor including:
a vertical fin defining a longitudinal length along a longitudinal axis;
source and drain regions separated by a gate region;
a gate structure disposed over the gate region, the gate structure including:
a dielectric layer disposed on the vertical fin; and
a gate electrode disposed on the dielectric layer;
wherein a first longitudinal section of the gate structure includes a dipole layer disposed between the dielectric layer and the vertical fin; and
wherein a second longitudinal section of the gate structure is devoid of the dipole layer whereby the dielectric layer is in contact with the vertical fin; and
an outer spacer disposed about the gate structure;
wherein the dipole layer is in contact with the outer spacer.

13. The semiconductor device of claim 12 wherein the field effect transistor is an nFET and wherein the dipole layer includes one of an aluminum oxide and a titanium oxide.

14. The semiconductor device of claim 12 wherein the field effect transistor is a pFET and wherein the dipole layer includes oxides of Group IIA or IIIB elements.

15. The semiconductor device of claim 12 including a contact in communication with each of the source and drain regions.

16. The semiconductor device of claim 12 wherein the dipole layer is spaced a predetermined distance from a wall of the outer spacer adjacent the drain region, the predetermined distance corresponding to the second longitudinal section of the gate structure.

17. The semiconductor device of claim 16 wherein the dipole layer is in contact with the outer spacer adjacent the source region.

18. The semiconductor device of claim 12 wherein the second longitudinal section of the gate structure devoid of the dipole layer is disposed adjacent the drain region.

19. The semiconductor device of claim 18 wherein the second longitudinal section of the gate structure extends between about 10% to about 50% of a longitudinal length of the gate structure.

20. The semiconductor device of claim 19 wherein the second longitudinal section of the gate structure extends about 25% of the longitudinal length of the gate structure.

* * * * *